United States Patent [19]
Von Borcke

[11] 3,934,160
[45] Jan. 20, 1976

[54] ARRANGEMENT FOR THE PRODUCTION OF ELECTRICAL SIGNALS BY WAY OF SEMICONDUCTOR COMPONENTS WHICH ARE DEPENDENT UPON A MAGNETIC FIELD

[75] Inventor: Ulrich Von Borcke, Regensburg, Germany

[73] Assignee: Siemens Aktiengesellschaft, Berlin and Munich, Germany

[22] Filed: June 3, 1974

[21] Appl. No.: 475,955

[30] Foreign Application Priority Data
June 12, 1973 Germany............................ 2329845

[52] U.S. Cl............. 307/309; 324/34 PS; 324/34 D; 324/DIG. 1; 338/32 R; 357/27
[51] Int. Cl.²................... H01L 43/08; H03K 17/90
[58] Field of Search......... 307/309; 338/32 R, 32 H; 357/27; 324/34 PS, 34 D, 46, DIG. 1; 73/DIG. 3

[56] References Cited
UNITED STATES PATENTS 3,286,161  11/1966  Jones et al.................... 338/32 R X
3,366,908  1/1968   Weiss et al........................ 338/32 R
3,846,697  11/1974  Cila et al. .......................... 324/46 X Primary Examiner—Siegfried H. Grimm
Attorney, Agent, or Firm—Hill, Gross, Simpson, Van Santen, Steadman, Chiara & Simpson

[57] ABSTRACT

An arrangement for producing electrical signals by way of semiconductor elements which are dependent upon a magnetic field employs at least two field plates which are arranged adjacent to each other on at least one pole of a magnet. An iron part can be moved over the field plates whose width is selected in such a way and which is guided with respect to the field plates in such a way that when the iron part completely covers one field plate the other plate is not covered. The field plates are magnetic field dependent two pole elements having an electrical resistance characteristic which changes as a function of an applied magnetic field so that electrical signals are generated in response to field change when the field plates are connected in an electrical circuit.

4 Claims, 7 Drawing Figures

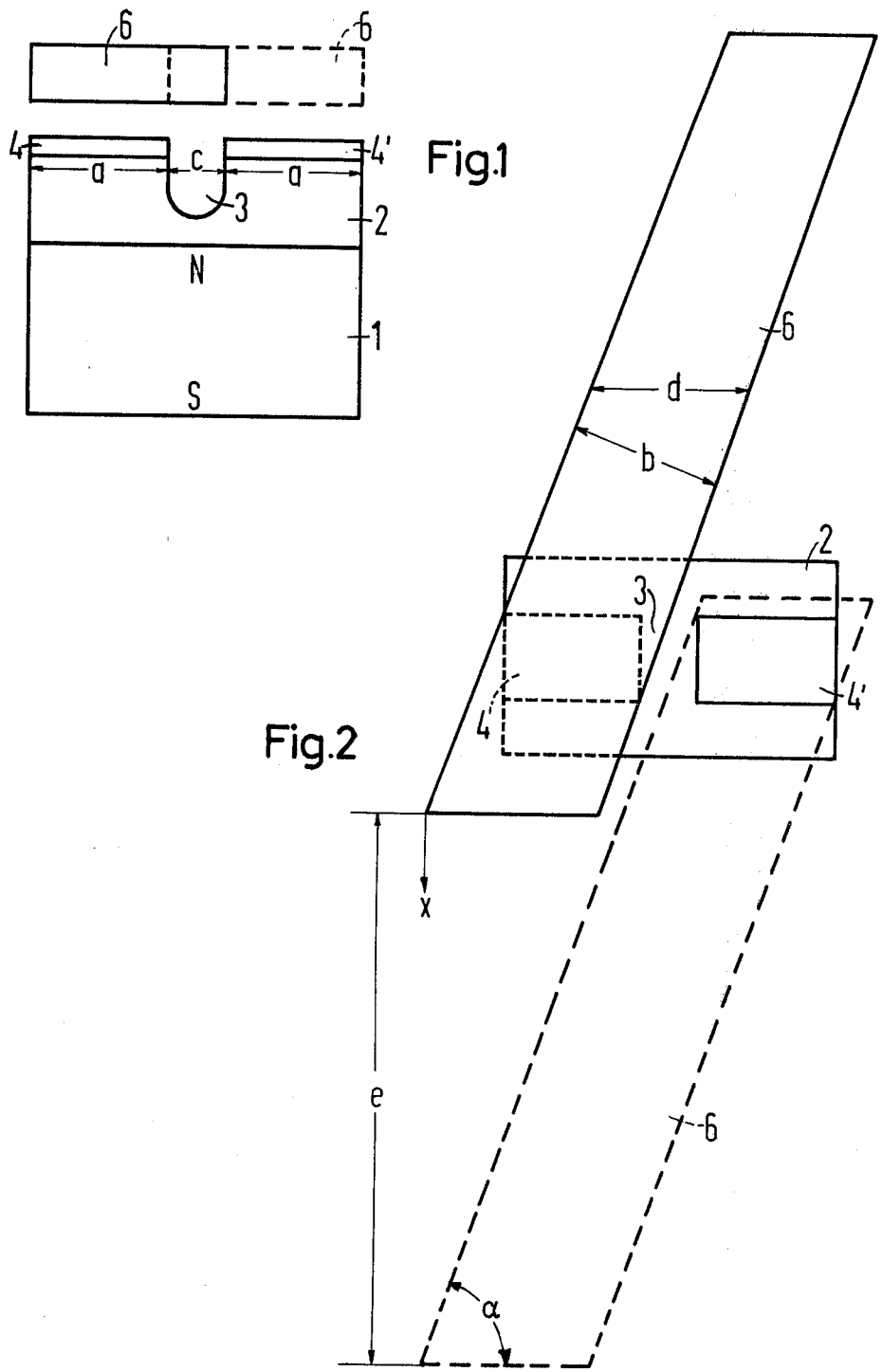

3,934,160

ARRANGEMENT FOR THE PRODUCTION OF ELECTRICAL SIGNALS BY WAY OF SEMICONDUCTOR COMPONENTS WHICH ARE DEPENDENT UPON A MAGNETIC FIELD

BACKGROUND OF THE INVENTION

1. Field of the Invention

The present invention relates to an arrangement for the production of electrical signals by way of semiconductor component elements which are dependent upon a magnetic field, and more particularly to such an arrangement in which at least two component elements, in the form of field plates, are arranged next to each other and spaced apart on at least one pole of a magnet. The component elements are dependent upon a magnetic field and the magnetic circuit in which the field dependent component elements are located can be influenced by an iron part which is moved over the component elements.

2. Description of the Prior Art

Arrangements of the above-mentioned type are generally known from the German Pat. No. 2,036,361. In that publication, two field plates are arranged on one pole of a magnet. An iron member which guides the magnetic flux is moved over these field plates so that every time when the iron part is situated above a field plate the magnetic flux is increased by the field plate and the resistance value of the field plate is thus changed. Due to this change of resistance, also the current flowing through the field plates changes, by means of which the movement of the iron part can be transformed into an electrical signal, which signal is a measure of this movement.

It is important for such an arrangement that the change of resistance be linear in as large a range as possible as a function of the change in the path of the iron member.

SUMMARY OF THE INVENTION

The primary object of the present invention is to provide an arrangement of the aforementioned type in which the linear zone is increased.

The problem of increasing the linear work is solved, according to the present invention, in that the projection of the width of the iron member onto the longitudinal plane of the magnetic fielddependent component element is at least equivalent to the length of the diagonal of a component element which is dependent upon the magnetic field and that the iron part in the plane of the magnetic field-dependent component elements is inclined in its longitudinal direction with respect to the longitudinal direction of the magnetic field-dependent component elements at an angle which may be so great as the most that, when the iron member completely covers one of the elements, the other element is not covered.

BRIEF DESCRIPTION OF THE DRAWINGS

Other objects, features and advantages of the invention, its organization, construction and operation will be best understood from the following detailed description taken in conjunction with the accompanying drawings, on which:

FIG. 1 is an elevational view of an arrangement constructed in accordance with the present invention;

FIG. 2 is a top plan view of the arrangement illustrated in FIG. 1;

DESCRIPTION OF THE PREFERRED EMBODIMENTS

Figure 3:
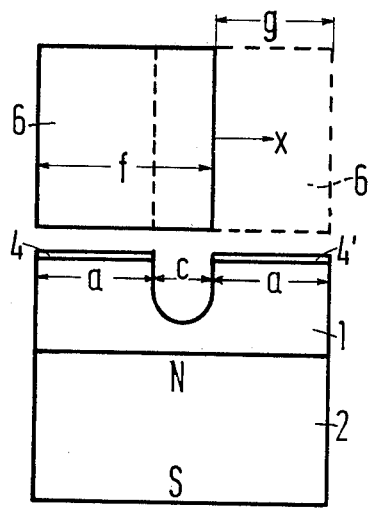
FIG. 3 is an elevational view of another embodiment of the invention.

Referring to FIG. 1, a permanent magnet 1 includes a north pole N and a south ple S. A pole piece 2 is carried on the north pole N and has a central zone which includes a recess 3 having a width $c$. A pair of field plates 4 and 4′, respectively, are arranged on the parts of the pole piece 2 which have a width $a$ and which are separated by the recess 3. These field plates 4, 4′ may be mounted on the pole piece 2, for example, by way of an adhesive. The field plates 4, 4′ are magnetic field dependent elements having an electrical resistance which varies as a function of a magnetic field applied thereto.

An iron member 6 is moved over the above described arrangement, the change of path of the iron member 6 over the field plates 4 and 4′ being converted into a corresponding electrical signal. As the top view of FIG. 2 illustrates, the longitudinal axis of the iron member 6, which has a width $b$, is inclined at an angle $\alpha$ with respect to the longitudinal direction of the field plates 4 and 4′ (horizontal direction in the plane of the character). Furthermore, the projection $d$ of the iron member 6 with the width $b$ onto the longitudinal axis is, at least in this embodiment, equivalent to the width $a$ of a field plate 4 or 4′, respectively.

In FIG. 2, the iron member 6 is illustrated in two possible end positions. In the first position the iron member 6 completely covers the field plate 4, as is illustrated by the solid lines. In the second position, the iron member 6 completely covers the field plate 4′, as illustrated by the broken lines.

If the iron member 6 in FIG. 2 is moved in one direction, the linear zone which can be obtained by this arrangement is then provided by a path length $e$ which corresponds to a displacement in the $x$ direction between the two end positions. The linear zone provided by the length $e$ can be changed by changing the angle $\alpha$ and the projection $d$.

In FIG. 3, an embodiment of the invention is illustrated which can be selected for smaller ranges of linearity in which the parts which are equivalent to those in FIGS. 1 and 2 are provided with the same reference characters. In the sample embodiment illustrated in FIG. 3, the angle $\alpha$ equals 90°, while the width $f$ of the iron member 6 is equivalent to the width $a$ of a field plate 4 or 4′ and the space $c$ between the field plates. The linearity range in this exemplary embodiment is equivalent to the distance $g$ when the iron member 6 is moved in the $x$ direction.

Figure 4:
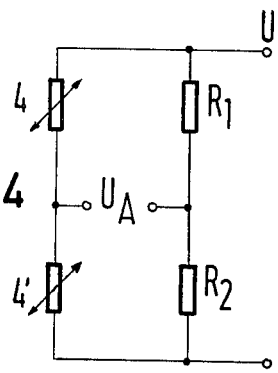
FIG. 4 is a schematic circuit diagram of a bridge circuit which includes the field plates of the arrangements illustrated in FIGS. 1-3.

FIG. 4 illustrates a bridge circuit in which the field plates 4 and 4′ are connected with two resistors $R_1$ and $R_2$. This bridge circuit is supplied at its input with a voltage U and is adjusted in such a way that its output voltage $U_A$ is zero in the center of the linearity zone corresponding to the path $e$ in FIG. 2 or the path $g$ in FIG. 3, respectively. When moving the iron member 6, the resistance changes or the changes in the voltage $U_A$, respectively, then extend linearly in the mentioned zones.

Figure 5:
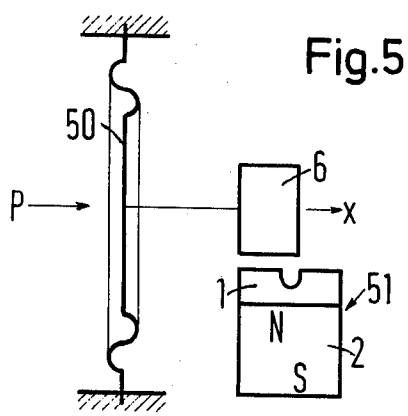
FIG. 5 is a schematic illustration of a pressure sensing element constructed in accordance with the principles of the invention.

FIG. 5 illustrates the use of an arrangement according to the invention in which the aforementioned structure is designated with a reference character 51 and which it is utilized in a pressure sensing element. The iron member 6 in FIGS. 1-3 is connected to a membrane 50 upon which a pressure P acts. With this structure, the linear movement of the iron member 6 in the $x$ direction, which is caused by the pressure P via the membrane 50, can be converted into a corresponding electrical signal.

Figure 6:
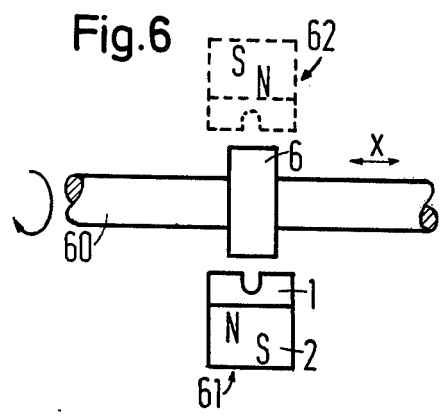
FIG. 6 is an illustration of an axial-play sensing element constructed in accordance with the principles of the present invention.

As applied to an axial-play sensing means, as illustrated in FIG. 6, the iron member 6 of the arrangement of the invention is arranged on a shaft 60 which rotates about its axis, while at least one arrangement 61, 62 of permanent magnet, pole piece and field plates is located adjacent to, in the drawing above and below, respectively, the shaft 60. Therefore, an axial displacement of the shaft in the $x$ direction can be determined.

Figure 7:
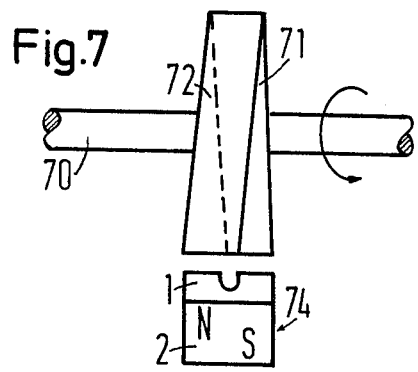
FIG. 7 is an illustration of a linear potentiometer which utilizes the arrangement of the present invention.

FIG. 7 illustrates a linear potentiometer in which an iron covering 72 is provided on a body 71 carried on a shaft 70 in such a way that the covering 72 is inclined at an angle $\alpha$ in the form as illustrated in FIG. 2, with respect to the arrangement designated with 74 and illustrates schematically as comprising a permanent magnet, pole piece and field plates. In this manner, the potentiometer is linear in a zone which, when rotating the shaft 70, corresponds to a displacement of the iron covering 72 between the two possible end positions above the field plates.

Although I have described my inventio by reference to particular illustrative embodiments thereof, many changes and modifications of the invention may become apparent to those skilled in the art without departing from the spirit and scope of the invention. I therefore intend to include within the patent warranted hereon, all such changes and modifications as may reasonably and properly be included with the scope of my contribution to the art.

I claim:

1. An arrangement for producing electrical signals by way of semiconductor component elements which are dependent upon a magnetic field, comprising: a magent having a pair of poles, a pole piece on one of said poles, a pair of magnetic field dependent semiconductor component elements arranged next to each other and spaced apart upon said pole piece, an iron member movable over said component elements, said iron member having a projection width onto the longitudinal plane of the magnetic field dependent elements which is at least equivalent to the length of the diagonal of a magnetic field dependent element, said iron member being inclined with respect to said magnetic field dependent component elements in its longitudinal direction with respect to the longitudinal direction of said elements lying at an angle which is sufficient to provide complete coverage of one of said elements while the other of said elements remains uncovered, the longitudinal plane of the magnetic field dependent component elements positioned parallel to the plane of motion of said iron part.

2. An arrangement according to claim 1 wherein the angle of inclination is 90°, the width of the iron member is equivalent to the width of a magnetic field dependent component element plus the space between said magnetic field dependent component elements.

3. An arrangement according to claim 1, comprising a bridge circuit which includes said magnetic field dependent component elements connected in series, a pair of resistors connected in parallel with said component elements, the parallel connected elements adapted to receive an input voltage, and a pair of output terminals connected to the respective junctions between said magnetic field component elements and said resistors.

4. The arrangement according to claim 1, comprising means for moving said iron member with respect to said magnetic field dependent component elements, and means for detecting the change in magnetic field intensity caused by such movement.

* * * * *